(12) United States Patent
Ishida et al.

(10) Patent No.: US 12,538,524 B2
(45) Date of Patent: Jan. 27, 2026

(54) TRANSISTOR, DISPLAY DEVICE, AND METHOD OF MANUFACTURING TRANSISTOR

(71) Applicant: SHARP KABUSHIKI KAISHA, Sakai (JP)

(72) Inventors: Izumi Ishida, Sakai (JP); Yujiro Takeda, Sakai (JP); Shinji Nakajima, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 638 days.

(21) Appl. No.: 17/918,884

(22) PCT Filed: Apr. 28, 2020

(86) PCT No.: PCT/JP2020/018118
§ 371 (c)(1),
(2) Date: Oct. 13, 2022

(87) PCT Pub. No.: WO2021/220401
PCT Pub. Date: Nov. 4, 2021

(65) Prior Publication Data
US 2023/0246108 A1      Aug. 3, 2023

(51) Int. Cl.
*H10D 30/67*       (2025.01)
*H10D 30/01*       (2025.01)
(52) U.S. Cl.
CPC ....... *H10D 30/6755* (2025.01); *H10D 30/031* (2025.01); *H10D 30/6729* (2025.01); *H10D 30/673* (2025.01); *H10D 30/6757* (2025.01)

(58) Field of Classification Search
CPC ............. H10D 30/6755; H10D 30/031; H10D 30/6729; H10D 30/673; H10D 30/6757; H10D 30/6734; H10D 30/021; H10D 86/423; H10D 86/451; H10D 86/60; H10K 59/1213
See application file for complete search history.

(56) References Cited

U.S. PATENT DOCUMENTS

| 2015/0060844 A1 | 3/2015 | Miyairi et al. |
| 2015/0263174 A1* | 9/2015 | Yamazaki ............. H10D 86/60 257/43 |
| 2018/0026138 A1 | 1/2018 | Yamaguchi et al. |

(Continued)

FOREIGN PATENT DOCUMENTS

| JP | 2015065426 A | 4/2015 |
| JP | 2015188080 A | 10/2015 |
| JP | 2018013525 A | 1/2018 |

(Continued)

*Primary Examiner* — Jonathan Han
(74) *Attorney, Agent, or Firm* — ScienBiziP, P.C.

(57) ABSTRACT

A transistor includes a bottom gate insulating film, an oxide semiconductor film, a top gate insulating film, a top gate electrode, a first interlayer insulating film, a source electrode, and a drain electrode, wherein the first interlayer insulating film contains carbon atoms, oxygen atoms, hydrogen atoms, and silicon atoms, hydrogen contained in the first interlayer insulating film has a higher concentration than hydrogen contained in the top gate insulating film, and oxygen contained in the first interlayer insulating film has a lower concentration than oxygen contained in the top gate insulating film.

21 Claims, 7 Drawing Sheets

(56) References Cited

U.S. PATENT DOCUMENTS

2018/0122835 A1     5/2018   Watakabe et al.
2020/0350341 A1   11/2020   Hanada et al.

FOREIGN PATENT DOCUMENTS

| JP | 2018074076 A | | 5/2018 |
|----|--------------|---|--------|
| JP | 2018182091 A | * | 11/2018 |
| JP | 2019129281 A | | 8/2019 |

\* cited by examiner

TRANSISTOR, DISPLAY DEVICE, AND METHOD OF MANUFACTURING TRANSISTOR

TECHNICAL FIELD

The present disclosure relates to transistors, methods of manufacturing transistors, and display devices including the transistors.

BACKGROUND ART

Much attention has been paid to, for example, liquid crystal display devices, OLED (organic light-emitting diode) display devices, and OLED (quantum-dot light-emitting diode) display devices, all of which include transistors including an oxide semiconductor film.

SUMMARY

Technical Problem

Japanese Unexamined Patent Application Publication No. 2018-74076 (Publication Date: May 10, 2018) describes forming a conductive region by bringing an oxide semiconductor film and a metal film into direct contact with each other, the oxide semiconductor film containing indium (In), gallium (Ga), zinc (Zn), and oxygen. However, this method of forming a conductive region disadvantageously requires an additional, separate step of forming and patterning a metal film to form the conductive region.

Japanese Unexamined Patent Application Publication No. 2019-129281 (Publication Date: Aug. 1, 2019) describes forming a conductive region by diffusing the hydrogen contained in a silicon nitride film into an oxide semiconductor film containing indium (In), gallium (Ga), zinc (Zn), and oxygen. However, this method of forming a conductive region inevitably results in the hydrogen contained in the silicon nitride film diffusing into a channel region as well as into a conductive region, thereby disadvantageously lowering the threshold voltage in the transistor characteristics or allowing current conduction in transistor elements with a relatively short channel region width (channel length).

Japanese Unexamined Patent Application Publication No. 2018-13525 (Publication Date: Jan. 25, 2018) describes forming a conductive region by diffusing the hydrogen contained in the silicon oxide ($SiO_2$) film prepared by using monosilane ($SiH_4$) and nitrogen oxide ($N_2O$) into an oxide semiconductor film containing indium (In), gallium (Ga), zinc (Zn), and oxygen. However, this method of forming a conductive region inevitably results in the hydrogen contained in the silicon oxide ($SiO_2$) film diffusing into a channel region as well as into a conductive region, thereby disadvantageously lowering the threshold voltage in the transistor characteristics or allowing current conduction in transistor elements with a relatively short channel region width (channel length).

The present disclosure, in an aspect thereof, has been made in view of these problems and has an object to provide a transistor that does not require an additional, separate step of forming and patterning a metal film to form the conductive region in an oxide semiconductor film and that exhibits good transistor characteristics (I-V characteristics) even with a relatively short channel region width (channel length) and also to provide a method of manufacturing such a transistor and a display device including the transistor.

A transistor in accordance with the present disclosure, to address the problems,
includes a bottom gate insulating film, an oxide semiconductor film, a top gate insulating film, a top gate electrode, and a first interlayer insulating film, all of which are provided on a substrate in a stated order,
the transistor including a source electrode and a drain electrode both electrically connected to the oxide semiconductor film via a contact hole formed through the first interlayer insulating film,
the oxide semiconductor film having a channel region in a portion overlapping the top gate insulating film in a plan view,
the channel region being interposed between a first conductive region of the oxide semiconductor film and a second conductive region of the oxide semiconductor film,
the first interlayer insulating film being in contact with the first conductive region, the second conductive region, the top gate insulating film, and the top gate electrode and containing carbon atoms, oxygen atoms, hydrogen atoms, and silicon atoms,
hydrogen contained in the first interlayer insulating film having a higher concentration than hydrogen contained in the top gate insulating film,
oxygen contained in the first interlayer insulating film having a lower concentration than oxygen contained in the top gate insulating film.

A display device in accordance with the present disclosure, to address the problems,
includes the transistor and
further includes a light-emitting element including:
a first electrode electrically connected to either the source electrode or the drain electrode;
a second electrode; and
a light-emitting layer between the first electrode and the second electrode.

A method of manufacturing a transistor in accordance with the present disclosure, to address the problems, includes the steps of:
forming an oxide semiconductor film on a substrate;
forming a top gate insulating film in contact with a portion of the oxide semiconductor film;
forming a top gate electrode overlapping the portion and the top gate insulating film and being in contact with the top gate insulating film;
forming an interlayer insulating film being in contact with the oxide semiconductor film except for the portion, with the top gate insulating film, and with the top gate electrode, containing carbon atoms, oxygen atoms, hydrogen atoms, and silicon atoms, containing hydrogen at a higher concentration than a concentration of hydrogen contained in the top gate insulating film, and containing oxygen at a lower concentration than a concentration of oxygen contained in the top gate insulating film;
forming a plurality of contact holes through the interlayer insulating film; and
forming a source electrode electrically connected to a first portion of the oxide semiconductor film other than the portion via one of the plurality of contact holes and a drain electrode electrically connected to a second portion of the oxide semiconductor film other than the portion via another one of the plurality of contact holes.

Advantageous Effects of Disclosure

The present disclosure, in an aspect thereof, can provide a transistor that exhibits stable properties even when the transistor is reduced in size and has a small channel region width (channel length) and can also provide a method of manufacturing such a transistor and a display device including the transistor.

DESCRIPTION OF EMBODIMENTS

Figure 1:
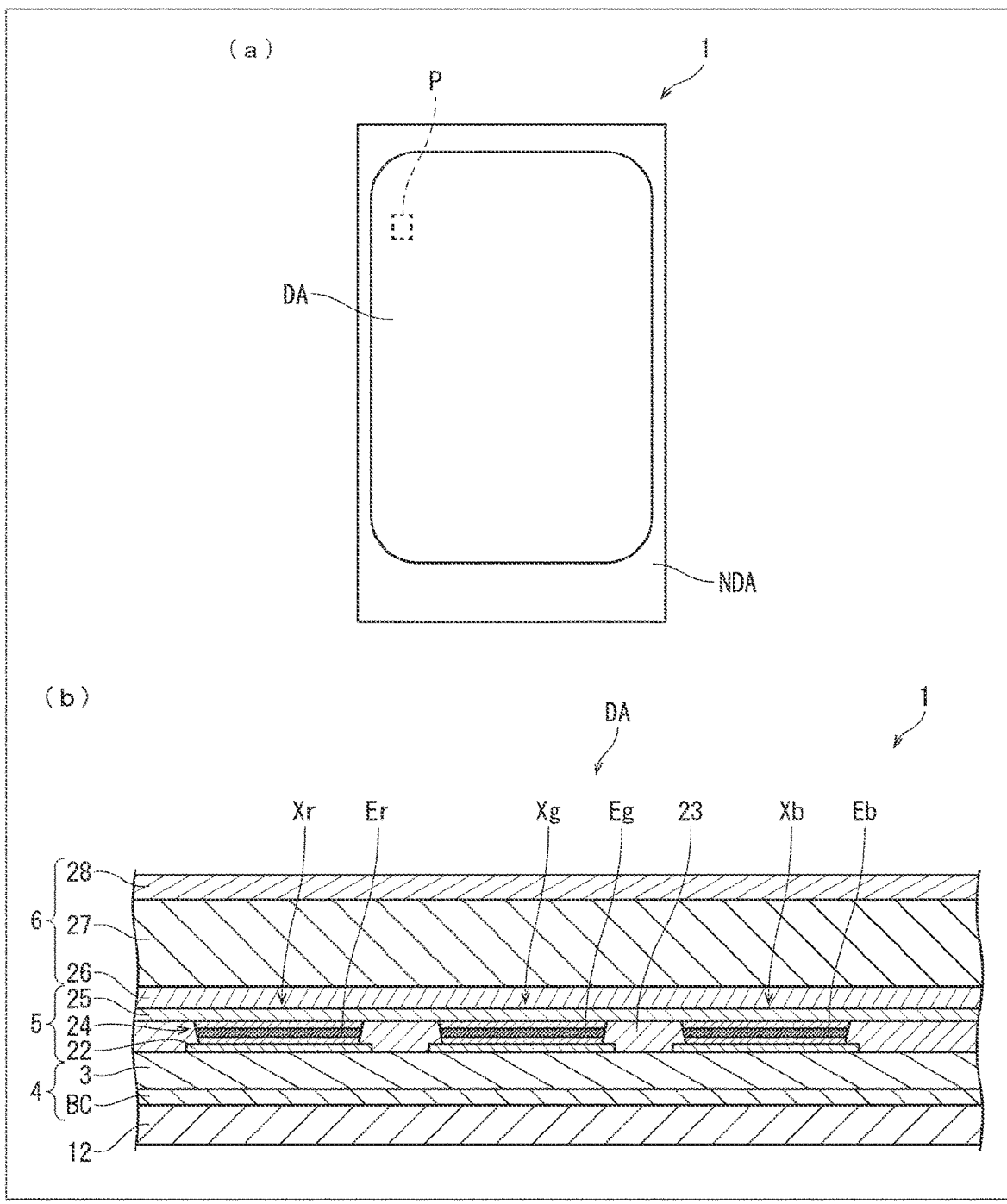
In FIG. 1, (a) is a schematic plan view of a structure of a display device in accordance with Embodiment 1, and (b) is a cross-sectional view of the structure of the display device in accordance with Embodiment 1.

The following will describe embodiments of the present disclosure with reference to FIGS. 1 to 11. Throughout the following, members of an embodiment that have the same arrangement and function as members of a particular embodiment are indicated by the same reference numerals and description thereof may be omitted for convenience of description.

Embodiment 1

Portion (a) of FIG. 1 is a schematic plan view of a structure of a display device 1 in accordance with Embodiment 1, and (b) of FIG. 1 is a cross-sectional view of the structure of the display device 1 in accordance with Embodiment 1.

As shown in (a) of FIG. 1, the display device 1 has a display area DA where there is provided a plurality of pixels P and a frame area NDA surrounding the display area DA.

As shown in (b) of FIG. 1, in the display area DA of the display device 1, there are provided a TFT (thin film transistor) layer 4, a light-emitting element layer 5, and a sealing layer 6, all of which are stacked on a substrate 12 in this order from the substrate 12 side.

The TFT layer 4 includes a barrier layer (base coat layer) BC on the substrate 12 and a stack body 3 on the barrier layer BC.

The substrate 12 is a flexible substrate made primarily of, for example, polyimide or a like resin. The barrier layer BC is an inorganic insulating layer that prevents penetration of foreign materials such as water and oxygen and may be made of, for example, silicon nitride or silicon oxide.

As shown in (b) of FIG. 1, the light-emitting element layer 5 on the TFT layer 4 includes red light-emitting elements Xr, green light-emitting elements Xg, and blue light-emitting elements Xb. The present embodiment describes, as an example, the light-emitting element layer 5 including the red light-emitting elements Xr, the green light-emitting elements Xg, and the blue light-emitting elements Xb. This is however not the only possible implementation of the disclosure. Alternatively, the light-emitting element layer 5 may include light-emitting elements that emit light of other colors, for example, yellow light-emitting elements or white light-emitting elements, as well as the red light-emitting elements Xr, the green light-emitting elements Xg, and the blue light-emitting elements Xb.

Each of the red light-emitting elements Xr, the green light-emitting elements Xg, and the blue light-emitting elements Xb includes: a first electrode 22 formed in an insular manner; an insulating edge cover film 23 covering the edge of the first electrode 22; a common, second electrode 25; and a functional layer 24 between the first electrode 22 and the second electrode 25.

The functional layer 24 in the red light-emitting element Xr includes a red light-emitting layer Er. The functional layer 24 in the green light-emitting element Xg includes a green light-emitting layer Eg. The functional layer 24 in the blue light-emitting element Xb includes a blue light-emitting layer Eb. Note that the functional layer 24 includes, for example, an electron injection layer, an electron transport layer, a hole transport layer, and a hole injection layer, as well as the red light-emitting layer Er, the green light-emitting layer Eg, and the blue light-emitting layer Eb.

For instance, when the first electrode 22 is an anode, and the second electrode 25 is a cathode, a hole injection layer and a hole transport layer may be provided in this order from the first electrode 22 side between the first electrode 22 and the red light-emitting layer Er, between the first electrode 22 and the green light-emitting layer Eg, and between the first electrode 22 and the blue light-emitting layer Eb, and an electron injection layer and an electron transport layer may be provided in this order from the second electrode 25 side between the second electrode 25 and the red light-emitting layer Er, between the second electrode 25 and the green light-emitting layer Eg, and between the second electrode 25 and the blue light-emitting layer Eb.

The edge cover film 23 is formed by, for example, applying an organic material such as polyimide or acrylic resin and subsequently patterning the applied organic material by photolithography.

When the first electrode 22 is an anode, the first electrode 22 may be a stack of, for example, ITO (indium tin oxide) and Ag (silver) so as to be reflective to visible light.

When the second electrode 25 is a cathode, the second electrode 25 may be made of, for example, a thin film of a metal such as a magnesium-silver alloy so as to be transmissive to visible light.

Each pixel P in the display device 1 shown in (a) of FIG. 1 includes a red subpixel, a green subpixel, and a blue subpixel. The red subpixel includes a red light-emitting element Xr. The green subpixel includes a green light-emitting element Xg. The blue subpixel includes a blue light-emitting element Xb.

The present embodiment describes, as an example, the red light-emitting elements Xr, the green light-emitting elements Xg, and the blue light-emitting elements Xb that are OLEDs (organic light-emitting diodes). This is however not the only possible implementation of the disclosure. Alternatively, the red light-emitting elements Xr, the green light-emitting elements Xg, and the blue light-emitting elements Xb may be QLEDs (quantum-dot light-emitting diodes) each including a quantum-dot layer as a light-emitting layer. Additionally, some of the red light-emitting elements Xr, the green light-emitting elements Xg, and the blue light-emitting elements Xb may be OLEDs, and the rest of the red light-emitting elements Xr, the green light-emitting elements Xg, and the blue light-emitting elements Xb may be QLEDs.

In addition, the present embodiment describes, as an example, the light-emitting element layer 5 provided on the TFT layer 4. This is however not the only possible implementation of the disclosure. Alternatively, there may be provided, for example, a liquid crystal display layer including a liquid crystal layer on the TFT layer 4.

As shown in (b) of FIG. 1, the sealing layer 6, covering the light-emitting element layer 5, prevents foreign materials such as water and oxygen from reaching the light-emitting element layer 5 and may be made of, for example, two layers (a first inorganic film 26 and a second inorganic film 28) and an organic film 27 provided between these two layers.

Figure 2:
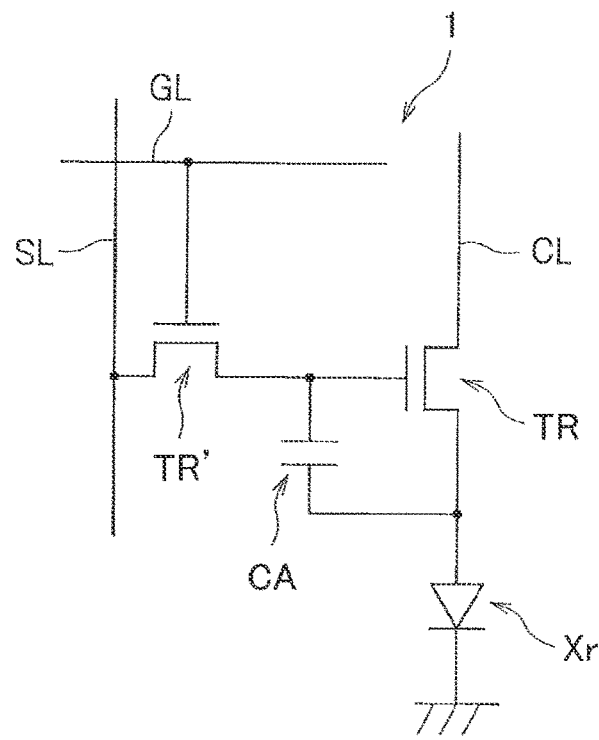
FIG. 2 is a diagram of an exemplary drive circuit in the display device in accordance with Embodiment 1.

FIG. 2 is a diagram of an exemplary drive circuit in the display device 1 in accordance with Embodiment 1.

The display device 1 includes a drive circuit for driving each of the red light-emitting element Xr, the green light-emitting element Xg, and the blue light-emitting element Xb that are provided in each pixel P. The drive circuit shown in FIG. 2 is an example of a drive circuit for driving the red light-emitting element Xr.

The drive circuit shown in FIG. 2 includes a transistor TR, a transistor TR', and a capacitive element CA. Note that the transistor TR, the transistor TR', and the capacitive element CA are contained in the TFT layer 4 shown in (b) of FIG. 1.

The present embodiment describes the transistor TR and the transistor TR' being transistors including an oxide semiconductor film.

Referring to FIG. 2, the transistor TR' has a gate electrode connected to a gate signal line GL, a source electrode connected to a source line SL, and a drain electrode connected to the gate electrode and the capacitive element CA of the transistor TR. The transistor TR has a source electrode connected to a current feed line CL and a drain electrode connected to the first electrode 22 of the red light-emitting element Xr. The red light-emitting element Xr has a conductive terminal connected to the second electrode 25.

The transistor TR' turns on upon receiving, at the gate electrode thereof, an ON signal from the gate signal line GL. The signal voltage on the source line SL, while the transistor TR' is ON, is applied to the capacitive element CA and the gate electrode of the transistor TR via the transistor TR'. the transistor TR turns on in response to the signal voltage. As a result, the electric current from the current feed line CL flows to the red light-emitting element Xr via the transistor TR, so that the red light-emitting element Xr emits light.

Figure 3:
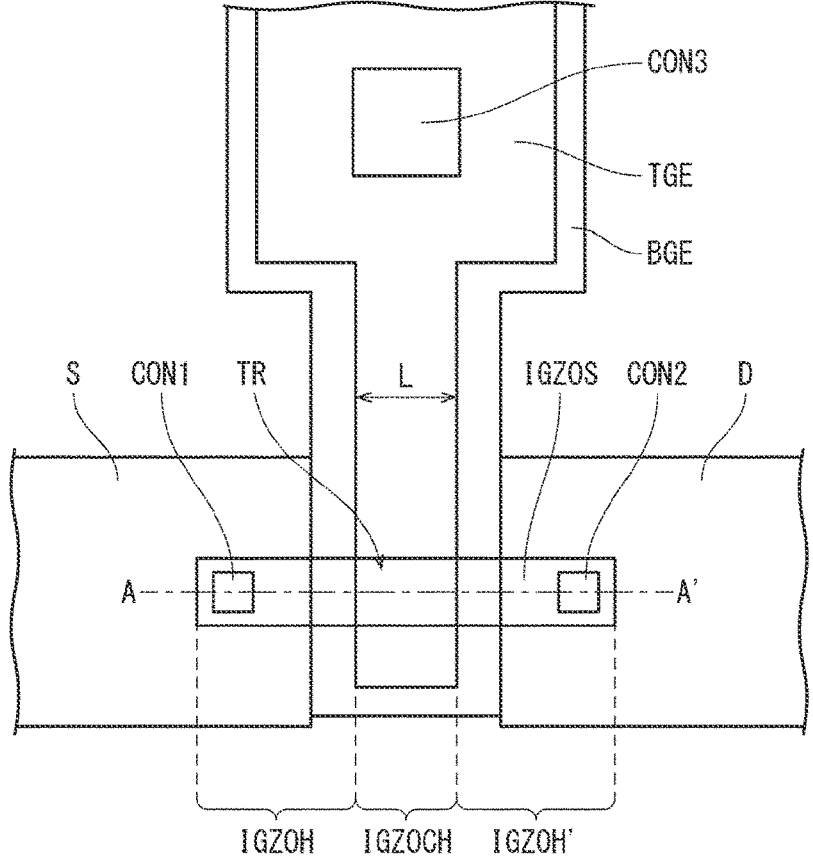
FIG. 3 is a plan view of a transistor in the display device in accordance with Embodiment 1.

FIG. 3 is a plan view of the transistor TR in the display device 1 in accordance with Embodiment 1.

Figure 4:
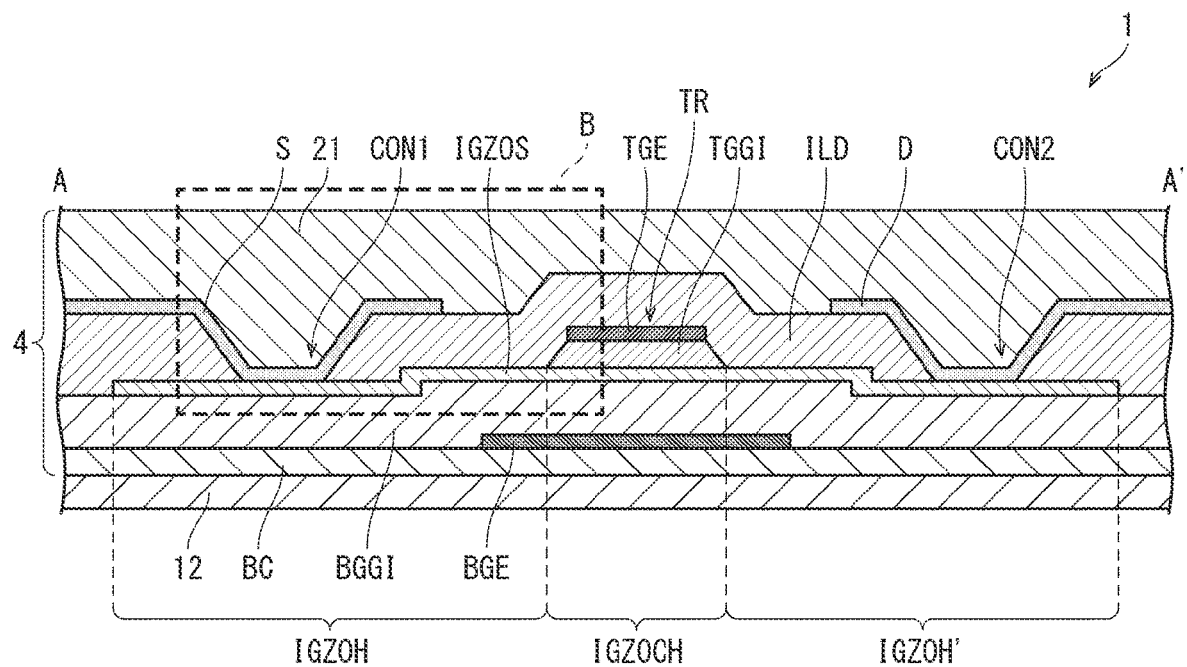
FIG. 4 is a cross-sectional view, taken along line A-A' of FIG. 3, of a cross-section of a structure of the transistor in the display device in accordance with Embodiment 1.

FIG. 4 is a cross-sectional view, taken along line A-A' in FIG. 3, of a cross-section of a structure of the transistor TR in the display device 1 in accordance with Embodiment 1.

Figure 5:
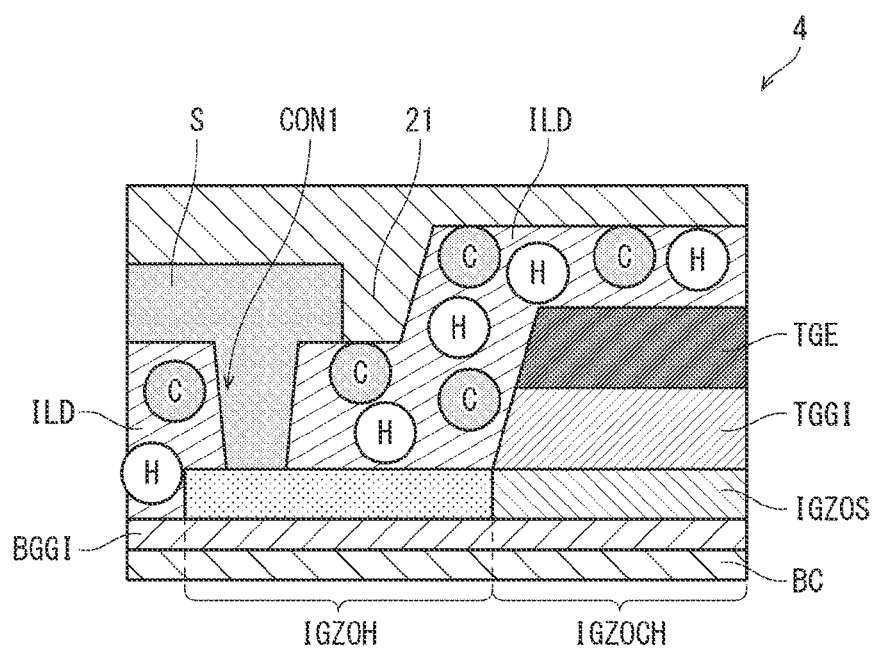
FIG. 5 is a partially enlarged view of portion B in FIG. 4, illustrating reasons why the hydrogen contained in a first interlayer insulating film can be restrained from diffusing into the channel region of an oxide semiconductor film in the transistor in the display device in accordance with Embodiment 1.

FIG. 5 is a partially enlarged view of portion B in FIG. 4, illustrating reasons why the hydrogen contained in a first interlayer insulating film ILD can be restrained from diffusing into the channel region IGZOCH of an oxide semiconductor film IGZOS in the transistor TR in the display device in accordance with Embodiment 1.

Referring to FIG. 4, the TFT layer 4 includes the barrier layer BC on the substrate 12. Note that although when the light-emitting element layer 5 is provided on the TFT layer 4, the barrier layer BC is preferably provided with a view to preventing foreign materials such as water and oxygen from reaching the light-emitting element layer 5, the barrier layer BC may be omitted, for example, when there is provided a liquid crystal display layer including a liquid crystal layer on the TFT layer 4.

The present embodiment describes, as an example, the TFT layer 4 including a bottom gate electrode BGE, a bottom gate insulating film BGGI, the oxide semiconductor film IGZOS, a top gate insulating film TGGI, a top gate electrode TGE, the first interlayer insulating film ILD, a source electrode S, a drain electrode D, and a planarization film 21. This is however not the only possible implementation of the disclosure.

Referring to FIG. 4, the transistor TR in the TFT layer 4 includes the bottom gate insulating film BGGI, the oxide semiconductor film IGZOS, the top gate insulating film TGGI, the top gate electrode TGE, the first interlayer insulating film ILD, the source electrode S, and the drain electrode D, all of which are provided in this order from the substrate 12 side.

The present embodiment describes, as an example, a case where: the transistor TR further includes the bottom gate electrode BGE and the bottom gate insulating film BGGI, both of which are provided in this order from the substrate 12 side, between the barrier layer BC and the oxide semiconductor film IGZOS on the substrate 12; and the top gate electrode TGE is electrically connected to the bottom gate electrode BGE, to further improve the transistor characteristics (I-V characteristics) of the transistor TR. This is however not the only possible implementation of the disclosure. Alternatively, the bottom gate electrode BGE and the bottom gate insulating film BGGI may not be provided.

The oxide semiconductor film IGZOS includes a first conductive region IGZOH, a second conductive region IGZOH', and the channel region IGZOCH between the first conductive region IGZOH and the second conductive region IGZOH'.

The first conductive region IGZOH and the second conductive region IGZOH' are conductive regions formed by the diffusion of the hydrogen contained in the first interlayer insulating film ILD and have such a higher electric conductivity than the channel region IGZOCH to be used as, for example, wiring. Note that although the first interlayer insulating film ILD can restrain the diffusion of the hydrogen contained in the first interlayer insulating film ILD to some extent because the first interlayer insulating film ILD so contains carbon atoms as to be formed as a relatively fine film, the hydrogen contained in the first interlayer insulating film ILD diffuses into the first conductive region IGZOH and the second conductive region IGZOH' because the first interlayer insulating film ILD is in direct contact with the first conductive region IGZOH and the second conductive region IGZOH'.

In contrast, the channel region IGZOCH is covered by the top gate insulating film TGGI and is not in direct contact with the first interlayer insulating film ILD. Additionally, the first interlayer insulating film ILD can restrain the diffusion of the hydrogen contained in the first interlayer insulating film ILD to some extent because the first interlayer insulating film ILD contains carbon atoms. Therefore, the hydrogen contained in the first interlayer insulating film ILD can be restrained from diffusing into the channel region IGZOCH. The channel region IGZOCH has a lower electric conductivity than the first conductive region IGZOH and the second conductive region IGZOH' and exhibits semiconductor properties.

Note that although the width of the channel region IGZOCH measured in the direction from the first conductive region IGZOH toward the second conductive region IGZOH' (the left and right direction in FIGS. 3 and 4), in other words, the channel length L shown in FIG. 3, is not limited in any particular manner, the channel region IGZOCH is increasingly conductive with a shorter channel length L due to the diffusion of hydrogen into the channel region IGZOCH. In the transistor TR in accordance with the present embodiment, since the hydrogen contained in the first interlayer insulating film ILD can be restrained from diffusing into the channel region IGZOCH as described above, good transistor properties (I-V characteristics) can be obtained even when the channel length L is less than or equal to 4 μm. The present embodiment describes, as an example, the channel length L being equal to 4 μm. This is however not the only possible implementation of the disclosure. Alternatively, the channel length L may be either longer or shorter than 4 μm.

In the display device field, there are such strong demands for high definition pixels and subpixels as to further reduce the channel length of the channel region of the transistor in the display device. Therefore, the transistor TR in accordance with the present embodiment can be suitably used in high definition display devices.

The oxide semiconductor film IGZOS is preferably a semiconductor film containing: oxygen; and at least one element selected from indium (In), gallium (Ga), tin (Sn), hafnium (Hf), zirconium (Zr), and zinc (Zn). For instance, the oxide semiconductor film IGZOS is preferably any one of an oxide semiconductor film containing indium (In), gallium (Ga), zinc (Zn), and oxygen, an oxide semiconductor film containing indium (In), tin (Sn), zinc (Zn), and oxygen, an oxide semiconductor film containing indium (In), zirconium (Zr), zinc (Zn), and oxygen, and an oxide semiconductor film containing indium (In), hafnium (Hf), zinc (Zn), and oxygen. Note that in the present embodiment, an oxide semiconductor film formed by sputtering and containing indium (In), gallium (Ga), zinc (Zn), and oxygen is used as the oxide semiconductor film IGZOS. This is however not the only possible implementation of the disclosure.

The top gate insulating film TGGI is in contact with the entire channel region IGZOCH and only covers the channel region IGZOCH. In other words, the top gate insulating film TGGI does not cover the first conductive region IGZOH and the second conductive region IGZOH' and only covers the entire channel region IGZOCH. In the present embodiment, the top gate insulating film TGGI is formed by forming a silicon oxide (e.g., $SiO_2$) film across the entire surface by CVD using a nitrogen oxide (e.g., $N_2O$) gas and a silane (e.g., $SiH_4$) gas and subsequently patterning the silicon oxide (e.g., $SiO_2$) film in such a manner that the silicon oxide (e.g., $SiO_2$) film is in contact with the entire channel region IGZOCH and only covers the channel region IGZOCH. This is however not the only possible implementation of the disclosure. Alternatively, as an example, a silicon nitride film or a silicon oxynitride film may be used as the top gate insulating film TGGI if the hydrogen contained in the top gate insulating film TGGI has a lower concentration than the hydrogen concentration in the first interlayer insulating film ILD (which will be described later), and the oxygen contained in the top gate insulating film TGGI has a higher concentration than the oxygen concentration in the first interlayer insulating film ILD (which will be described later).

Note that because the presence of carbon in the interface between the top gate insulating film TGGI and the channel region IGZOCH could degrade reliability, the carbon atoms contained in the top gate insulating film TGGI preferably have a concentration of less than $5\times10^{17}$ atoms/cm$^3$, and more preferably no carbon atoms are contained.

In addition, since the top gate insulating film TGGI is in direct contact with the channel region IGZOCH, the hydrogen contained in the top gate insulating film TGGI could diffuse into the channel region IGZOCH, inconveniently rendering the channel region IGZOCH conductive. Hence, the hydrogen atoms contained in the top gate insulating film TGGI preferably have a concentration of greater than or equal to $1\times10^{17}$ atoms/cm$^3$ and less than $1\times10^{18}$ atoms/cm$^3$.

Note that the concentration of each atom contained in the top gate insulating film TGGI is controllable in a suitable manner by adjusting the quantity of each gas supplied in forming the top gate insulating film TGGI by CVD.

The preferred concentration of the carbon atoms and the preferred concentration of the hydrogen atoms contained in the aforementioned top gate insulating film TGGI are the concentrations in the top gate insulating film TGGI in the TFT layer 4. In addition, these concentrations can be analyzed by, for example, TOF-SIMS (Time of Flight-Secondary Ion Mass Spectrometry).

Additionally, the top gate insulating film TGGI has a thickness of preferably greater than or equal to 50 nm and less than or equal to 300 nm and more preferably greater than or equal to 100 nm and less than or equal to 200 nm, with a view to obtaining good transistor properties at lower voltage.

The top gate electrode TGE overlaps the channel region IGZOCH and the top gate insulating film TGGI and is in contact with the top gate insulating film TGGI. The top gate electrode TGE is made of, for example, a monolayer or multilayer film of at least one of metals of aluminum, tungsten, molybdenum, tantalum, chromium, titanium, and copper.

The first interlayer insulating film ILD is in contact with the first conductive region IGZOH, the second conductive region IGZOH', the top gate insulating film TGGI, and the top gate electrode TGE and contains carbon atoms, oxygen atoms, hydrogen atoms, and silicon atoms. In the present embodiment, the first interlayer insulating film ILD is formed by forming, across the entire surface, a silicon oxide (e.g., $SiO_2$) film containing carbon atoms, oxygen atoms, hydrogen atoms, and silicon atoms by CVD using a TEOS (tetra-ethoxy-silane) gas and an oxygen gas. This is however not the only possible implementation of the disclosure. Alternatively, as an example, a silicon oxynitride film may be used as the first interlayer insulating film ILD if the silicon oxynitride film contains carbon atoms, oxygen atoms, hydrogen atoms, and silicon atoms, has a higher hydrogen concentration than the hydrogen concentration in the top gate insulating film TGGI, and has a lower oxygen concentration than the oxygen concentration in the top gate insulating film TGGI.

The carbon atoms contained in the first interlayer insulating film ILD has a concentration of preferably greater than or equal to $5 \times 10^{17}$ atoms/cm$^3$ and more preferably greater than or equal to $1 \times 10^{18}$ atoms/cm$^3$ and less than or equal to $1 \times 10^{19}$ atoms/cm$^3$, with a view to restraining the hydrogen contained in the first interlayer insulating film ILD from diffusing into the channel region IGZOCH.

Additionally, the hydrogen atoms contained in the first interlayer insulating film ILD has a concentration of preferably greater than or equal to $1 \times 10^{18}$ atoms/cm$^3$ and less than or equal to $1 \times 10^{19}$ atoms/cm$^3$, with a view to restraining hydrogen from diffusing into, and thereby rendering conductive, the first conductive region IGZOH and the second conductive region IGZOH' and to restraining the hydrogen contained in the first interlayer insulating film ILD from diffusing into the channel region IGZOCH.

Note that the concentration of each atom contained in the first interlayer insulating film ILD is controllable in a suitable manner by adjusting the quantity of each gas supplied in forming the first interlayer insulating film ILD by CVD.

The preferred concentration of the carbon atoms and the preferred concentration of the hydrogen atoms contained in the aforementioned first interlayer insulating film ILD are the concentrations in the first interlayer insulating film ILD in the TFT layer 4. In addition, these concentrations can be analyzed by, for example, TOF-SIMS (Time of Flight-Secondary Ion Mass Spectrometry).

Additionally, the first interlayer insulating film ILD has a thickness of preferably greater than or equal to 150 nm and less than or equal to 1 µm and more preferably greater than or equal to 300 nm and less than or equal to 600 nm, with a view to obtaining good transistor properties.

Referring to FIG. 4, the first interlayer insulating film ILD has formed a contact hole CON1 and a contact hole CON2. In the present embodiment, the contact hole CON1 and the contact hole CON2 are formed by dry etching. This is however not the only possible implementation of the disclosure.

The source electrode S electrically connected to the first conductive region IGZOH via the contact hole CON1 and the drain electrode D electrically connected to the second conductive region IGZOH' via the contact hole CON2 are provided. The source electrode S and the drain electrode D can be formed by forming a metal film across the entire surface and thereafter patterning the metal film. The present embodiment describes, as an example, the transistor TR having the drain electrode D thereof electrically connected to the first electrode (anode) 22 shown in (b) of FIG. 1. This is however not the only possible implementation of the disclosure. For instance, when the source electrode S and the drain electrode D swap their roles, the source electrode S is electrically connected to the first electrode 22 shown in (b) of FIG. 1. The metal film of which the source electrode S and the drain electrode D are formed may be, for example, a monolayer or multilayer film of at least one of metals of aluminum, tungsten, molybdenum, tantalum, chromium, titanium, and copper.

The planarization film 21 is formed across the entire surface so as to cover the source electrode S, the drain electrode D, and the first interlayer insulating film ILD and may be made of, for example, an organic material, such as polyimide or acrylic resin, that can be provided by printing or coating technology. Note that the planarization film 21 has a contact hole (not show) for electrically connecting the drain electrode D to the first electrode 22 shown in (b) of FIG. 1.

Referring to FIG. 5, in the TFT layer 4 in the display device 1 in accordance with the present embodiment, the channel region IGZOCH is covered with the top gate insulating film TGGI and is not in direct contact with the first interlayer insulating film ILD. Additionally, the first interlayer insulating film ILD, since containing carbon atoms, is capable of restraining diffusion of the hydrogen contained in the first interlayer insulating film ILD to some extent, therefore restraining the hydrogen contained in the first interlayer insulating film ILD from diffusing into the channel region IGZOCH.

Referring to FIGS. 3 and 4, the transistor TR in accordance with the present embodiment further includes, between the substrate 12 and the oxide semiconductor film IGZOS: the bottom gate electrode BGE overlapping at least the channel region IGZOCH; and the bottom gate insulating film BGGI being in contact with the channel region IGZOCH and the bottom gate electrode BGE and overlapping at least the bottom gate electrode BGE, both of which are provided in this order from the substrate 12 side. Then, as shown in FIG. 3, the top gate electrode TGE is electrically connected to the bottom gate electrode BGE via a second contact hole CON3 formed through the top gate insulating film TGGI and the bottom gate insulating film BGGI.

Figure 6:
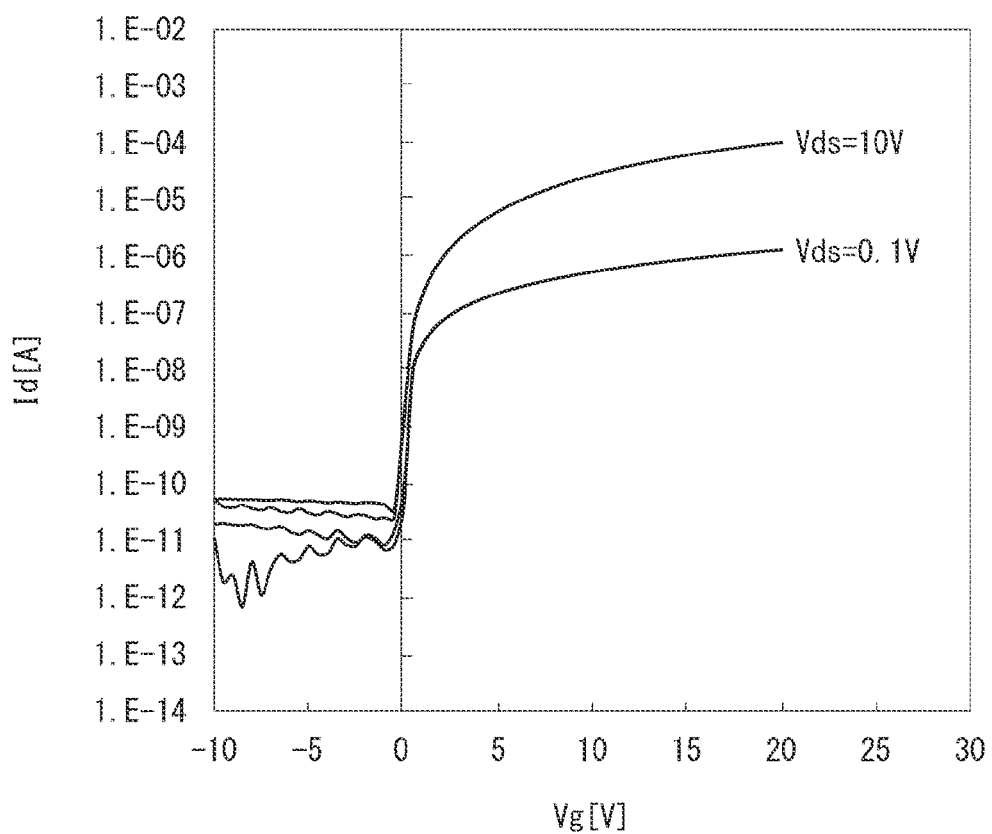
FIG. 6 is a diagram representing the I-V characteristics of the transistor in the display device in accordance with Embodiment 1.

FIG. 6 is a diagram representing the I-V characteristics of the transistor TR in the display device 1.

Referring to FIG. 6, the transistor TR can be realized which does not exhibit, for example, reduced threshold voltage or conductivity in I-V characteristics and which has excellent transistor properties.

Figure 7:
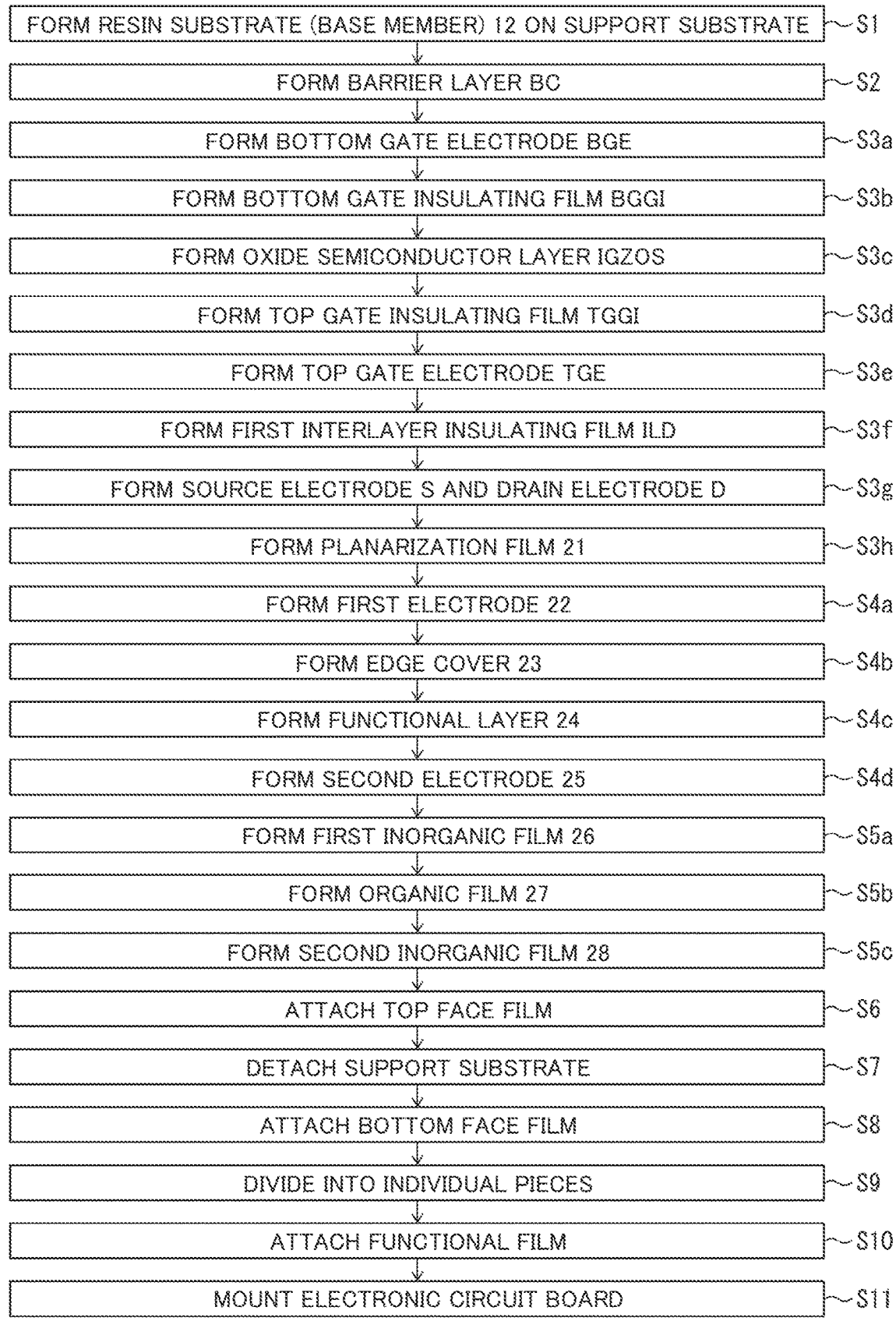
FIG. 7 is a diagram representing a method of manufacturing the display device in accordance with Embodiment 1.

FIG. 7 is a diagram representing a method of manufacturing the display device 1 in accordance with Embodiment 1.

The following will describe a method of manufacturing the display device 1 including the TFT layer 4 with reference to FIGS. 4 and 7.

The method of manufacturing the TFT layer 4 includes the following steps. First, the substrate (base member) 12 is formed on a support substrate (not shown) by coating (step S1). Next, the barrier layer BC, which is a first inorganic insulating film, is formed on the substrate by CVD (step S2). Next, a first metal layer is formed on the barrier layer BC by sputtering, and the bottom gate electrode BGE is formed by photolithography (step S3a). Next, the second bottom gate insulating film BGGI, which is a second inorganic insulating film, is formed by CVD (step S3b). Next, an oxide semiconductor film is formed by CVD, and the oxide semiconductor film IGZOS is formed by photolithography (step S3c). Next, a third inorganic insulating film is formed by CVD, and the top gate insulating film TGGI is formed in contact with a part of the region (channel region IGZOCH) of the oxide semiconductor film IGZOS by photolithography (step S3d). Next, the second metal layer is formed by sputtering, and the top gate electrode TGE is formed which overlaps that part of the region (channel region IGZOCH) and the top gate insulating film TGGI and which is in contact with the top gate insulating film TGGI, by photolithography (step S3e). Next, a fourth inorganic insulating film is, by CVD, formed that is in contact with the oxide semiconductor film IGZOS except for the aforementioned part of the region (channel region IGZOCH), with the top gate insulating film TGGI, and with the top gate electrode TGE, that contains carbon atoms, oxygen atoms, hydrogen atoms, and silicon atoms, that has a higher hydrogen concentration than the hydrogen concentration in the top gate insulating film TGGI, and that has a lower oxygen concentration than the oxygen concentration in the top gate insulating film TGGI. Then, the first interlayer insulating film ILD with the contact hole CON1 and the contact hole CON2 is formed by photolithography (step SM). Next, a third metal layer is formed by sputtering, and the source electrode S, which is electrically connected to a first region (first conductive region IGZOH) of the oxide semiconductor film IGZOS via the contact hole CON1, the first region being other than the aforementioned part of the region (channel region IGZOCH) of the oxide semiconductor film IGZOS, and the drain electrode D, which is electrically connected to a second region (second conductive region IGZOH') of the oxide semiconductor film IGZOS via the contact hole CON2, the second region being other than the aforementioned part of the region (channel region IGZOCH) of the oxide semiconductor film IGZOS, are formed by photolithography (step S3g). Then, the planarization film 21 is formed on the TFT layer 4 formed as described above (step S3h). Next, the first electrode 22 is formed on the planarization film 21 (step S4a). Next, an edge cover 23 is formed so as to cover the edges of the first electrode 22 (step S4b). Next, the layers in the light-emitting element layer 5 except for the first electrode 22 and the second electrode 25 are formed (step S4c). Next, the second electrode 25 is formed (step S4d). Next, the first inorganic film 26 is formed which is a part of a sealing film (step S5a). Next, the organic film 27 is formed which is a part of the sealing film (step S5b). Next, the second inorganic film 28 is formed which is a part of the sealing film (step S5c). Then, a top face film is attached (step S6). Next, the support substrate is detached (step S7), and a bottom face film is attached to the surface from the support substrate has been detached (step S8). Next, the workpiece is divided into individual pieces (step S9). Next, a functional film is attached (step S10). Finally, an electronic circuit board is mounted (step S11).

The display device 1 including the TFT layer 4 can be manufactured as described in the foregoing.

The method of manufacturing the TFT layer 4 in accordance with the present embodiment has been described, as an example, as including, before the step of forming the oxide semiconductor film IGZOS on the substrate 12 (step S3c), the step of forming the bottom gate electrode BGE on the substrate 12 (step S3a) and the step of forming the bottom gate insulating film BGGI overlapping at least the bottom gate electrode BGE (step S3b). This is however not the only possible implementation of the disclosure. The step of forming the bottom gate electrode BGE on the substrate 12 (step S3a) and the step of forming the bottom gate insulating film BGGI overlapping at least the bottom gate electrode BGE (step S3b) may be omitted where appropriate.

In addition, in the method of manufacturing the TFT layer 4 described above, a step of forming the second contact hole CON3 in the top gate insulating film TGGI and the bottom gate insulating film BGGI is preferably further included between the step of forming the top gate insulating film TGGI (step S3d) and the step of forming the top gate electrode TGE (step S3e), and the top gate electrode TGE is preferably electrically connected to the bottom gate electrode BGE via the second contact hole CON3.

Figure 8:
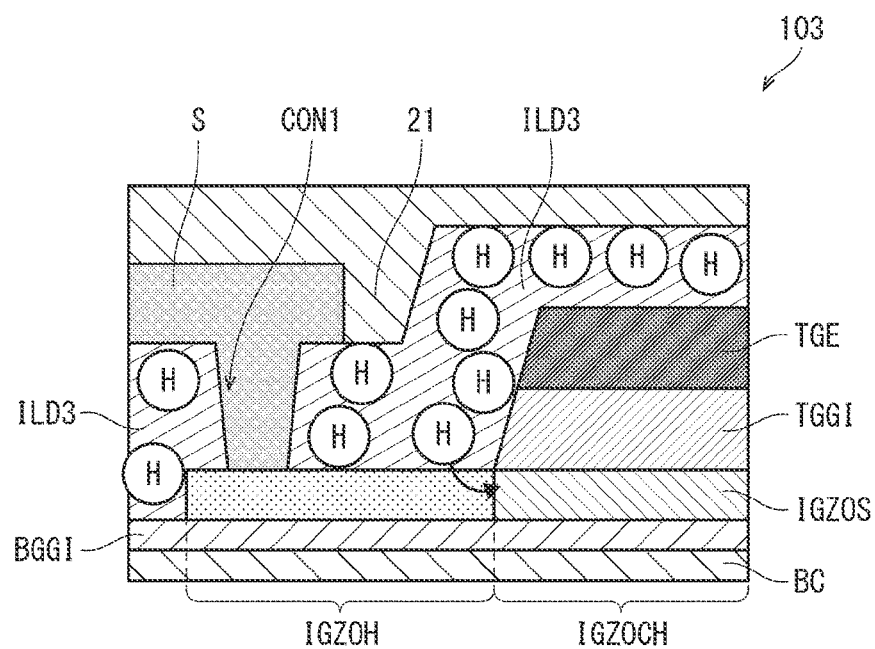
FIG. 8 is a diagram illustrating reasons why the hydrogen contained in an interlayer insulating film inevitably diffuses into the channel region of an oxide semiconductor film in a transistor in a display device in accordance with a comparative example.

FIG. 8 is a diagram illustrating reasons why the hydrogen contained in an interlayer insulating film ILD3 inevitably diffuses into the channel region IGZOCH of the oxide semiconductor film IGZOS in a TFT layer 103 in a display device in accordance with a comparative example.

Figure 9:
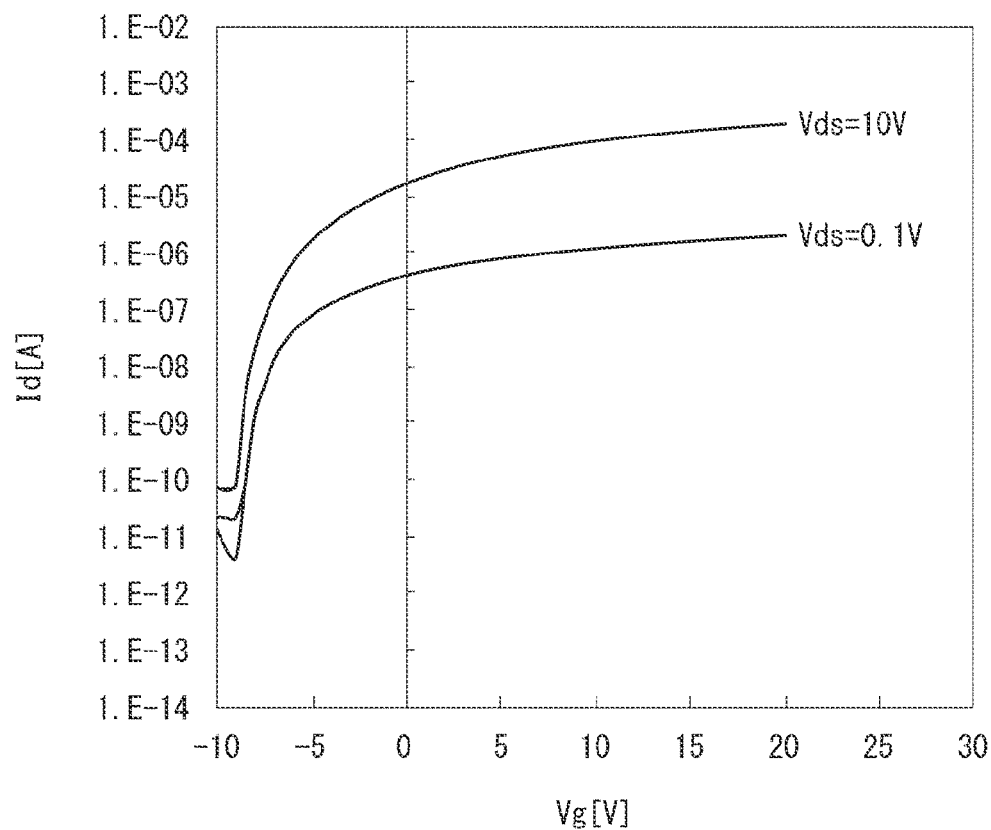
FIG. 9 is a diagram representing the I-V characteristics of the transistor in the display device in accordance with the comparative example shown in FIG. 8.

FIG. 9 is a diagram representing the I-V characteristics of the transistor in the display device in accordance with the comparative example shown in FIG. 8.

The TFT layer 103 shown in FIG. 8 differs from the TFT layer 4 shown in FIG. 5 in that the former includes the interlayer insulating film ILD3 in place of the first interlayer insulating film ILD. The interlayer insulating film ILD3 contains hydrogen and is either a carbon-free silicon nitride film or a carbon-free silicon oxide ($SiO_2$) film formed by CVD using a nitrogen oxide (e.g., $N_2O$) gas and a silane (e.g., $SiH_4$) gas.

Referring to FIG. 8, the carbon-free interlayer insulating film ILD3 is not capable of restraining diffusion of hydrogen, allowing the hydrogen contained in the interlayer insulating film ILD3 to diffuse also into the channel region IGZOCH. In the comparative example shown in FIG. 8, similarly to the present embodiment, since the channel region IGZOCH is formed with a width (channel length) as relatively short as 4 µm, the threshold voltage falls in the I-V characteristics, and the transistor properties deteriorate, in both cases where Vds is equal to 10 V and 0.1 V, as shown in FIG. 9.

Embodiment 2

Figure 10:
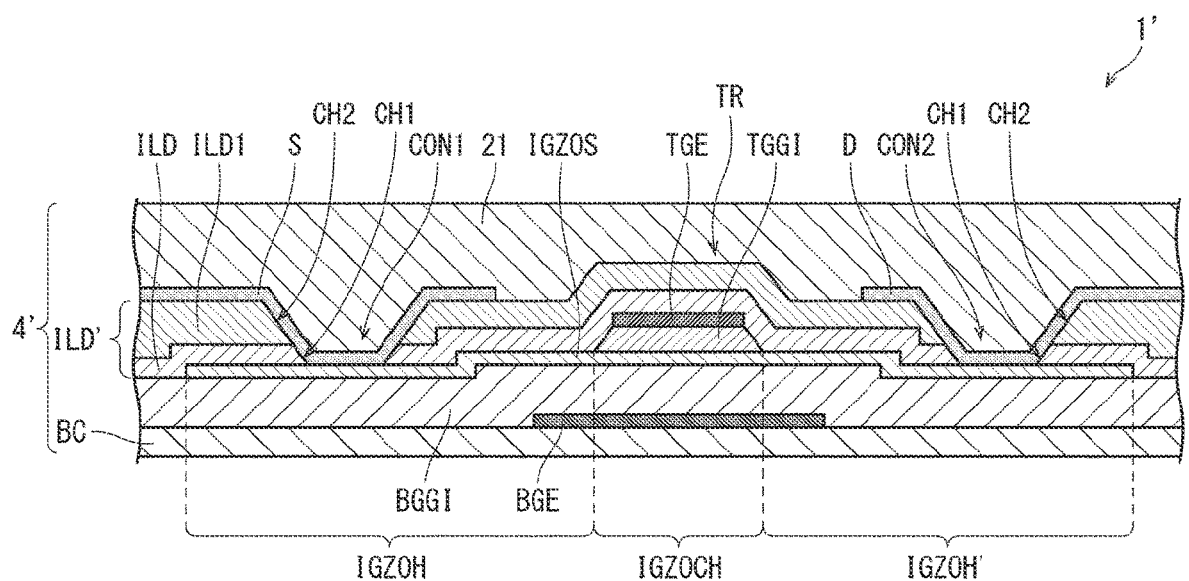
FIG. 10 is a cross-sectional view of a structure of a transistor in a display device in accordance with Embodiment 2.

A description is given next of Embodiment 2 of the present disclosure with reference to FIG. 10. The transistor TR in accordance with the present embodiment differs from Embodiment 1 in that the transistor TR includes an interlayer insulating film ILD' made of two layers (a first interlayer insulating film ILD and a second interlayer insulating film ILD1) and is otherwise the same as in Embodiment 1. For convenience of description, members of the present embodiment that have the same function as members shown in the drawings for Embodiment 1 will be indicated by the same reference numerals, and description thereof is omitted.

FIG. 10 is a cross-sectional view of a structure of the transistor TR in a TFT layer 4' in a display device 1' in accordance with Embodiment 2.

Referring to FIG. 10, the interlayer insulating film ILD' includes the second interlayer insulating film ILD1 as well as the first interlayer insulating film ILD described earlier in Embodiment 1. The second interlayer insulating film ILD1 is disposed farther from the substrate 12 than is the first interlayer insulating film ILD. The second interlayer insulating film ILD1 is in contact with the first interlayer insulating film ILD and has a third contact hole CH2 overlapping a contact hole CH1 formed through the first interlayer insulating film ILD. The interlayer insulating film ILD' hence has formed therein the contact hole CON1 and the contact hole CON2.

The second interlayer insulating film ILD1 may be made of any of silicon nitride, silicon oxide, and silicon oxynitride. The second interlayer insulating film ILD1 may be, for example, either a carbon-free silicon nitride film or a carbon-free silicon oxide ($SiO_2$) formed by CVD using a nitrogen oxide (e.g., $N_2O$) gas and a silane (e.g., $SiH_4$) gas.

Note that the concentration of each atom contained in the second interlayer insulating film ILD1 is controllable in a suitable manner by adjusting the quantity of each gas supplied in forming the second interlayer insulating film ILD1 by CVD.

By constructing the interlayer insulating film ILD' from two layers as described in the foregoing, the moisture-proof property of the transistor and the light-emitting element can be improved.

Embodiment 3

Figure 11:
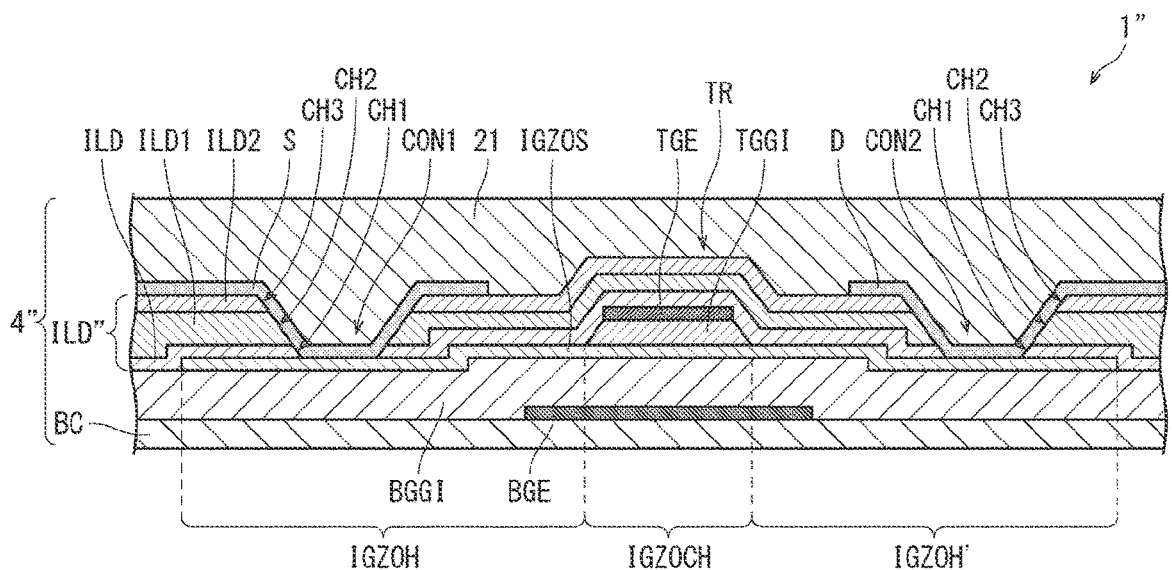
FIG. 11 is a cross-sectional view of a structure of a transistor in a display device in accordance with Embodiment 3.

A description is given next of Embodiment 3 of the present disclosure with reference to FIG. 11. The transistor TR in accordance with the present embodiment differs from Embodiments 1 and 2 in that the transistor TR includes an interlayer insulating film ILD" made of three layers (a first interlayer insulating film ILD, a second interlayer insulating film ILD1, and a third interlayer insulating film ILD2) and is otherwise the same as in Embodiments 1 and 2. For convenience of description, members of the present embodiment that have the same function as members shown in the drawings for Embodiments 1 and 2 will be indicated by the same reference numerals, and description thereof is omitted.

FIG. 11 is a cross-sectional view of a structure of the transistor TR in a TFT layer 4" in a display device 1" in accordance with Embodiment 3.

Referring to FIG. 11, the interlayer insulating film ILD" includes the third interlayer insulating film ILD2 as well as the first interlayer insulating film ILD described earlier in Embodiment 1 and the second interlayer insulating film ILD1 described earlier in Embodiment 2. The third interlayer insulating film ILD2 is disposed farther from the substrate 12 than is the second interlayer insulating film ILD1. The second interlayer insulating film ILD1 is disposed farther from the substrate 12 than is the first interlayer insulating film ILD. The third interlayer insulating film ILD2 is in contact with the second interlayer insulating film ILD1 and has a fourth contact hole CH3 overlapping the contact hole CH1 formed through the first interlayer insulating film ILD and the third contact hole CH2 formed through the second interlayer insulating film ILD1. The interlayer insulating film ILD" hence has formed therein the contact hole CON1 and the contact hole CON2.

The third interlayer insulating film ILD2 may be made of any of silicon nitride, silicon oxide, and silicon oxynitride. The third interlayer insulating film ILD2 may be, for example, either a carbon-free silicon nitride film or a carbon-free silicon oxide ($SiO_2$) formed by CVD using a nitrogen oxide (e.g., $N_2O$) gas and a silane (e.g., $SiH_4$) gas.

Note that the concentration of each atom contained in the third interlayer insulating film ILD2 is controllable in a suitable manner by adjusting the quantity of each gas supplied in forming the third interlayer insulating film ILD2 by CVD.

By constructing the interlayer insulating film ILD" from three layers as described in the foregoing, the moisture-proof property of the transistor and the light-emitting element can be further improved.

GENERAL DESCRIPTION

Aspect 1

A transistor including a bottom gate insulating film, an oxide semiconductor film, a top gate insulating film, a top gate electrode, and a first interlayer insulating film, all of which are provided on a substrate in a stated order, the transistor including a source electrode and a drain electrode both electrically connected to the oxide semiconductor film via a contact hole formed through the first interlayer insulating film, the oxide semiconductor film having a channel region in a portion overlapping the top gate insulating film in a plan view, the channel region being interposed between a first conductive region of the oxide semiconductor film and a second conductive region of the oxide semiconductor film, the first interlayer insulating film being in contact with the first conductive region, the second conductive region, the top gate insulating film, and the top gate electrode and containing carbon atoms, oxygen atoms, hydrogen atoms, and silicon atoms, hydrogen contained in the first interlayer insulating film having a higher concentration than hydrogen contained in the top gate insulating film, oxygen contained in the first interlayer insulating film having a lower concentration than oxygen contained in the top gate insulating film.

Aspect 2

The transistor of aspect 1, wherein the carbon atoms contained in the first interlayer insulating film have a concentration of greater than or equal to $5 \times 10^{17}$ atoms/cm$^3$.

Aspect 3

The transistor of aspect 2, wherein the carbon atoms contained in the first interlayer insulating film have a concentration of greater than or equal to $1 \times 10^{18}$ atoms/cm$^3$.

Aspect 4

The transistor of any one of aspects 1 to 3, wherein the hydrogen atoms contained in the first interlayer insulating film have a concentration of greater than or equal to $1 \times 10^{18}$ atoms/cm$^3$ and less than or equal to $1 \times 10^9$ atoms/cm$^3$.

Aspect 5

The transistor of any one of aspects 1 to 4, wherein the first interlayer insulating film has a thickness of greater than or equal to 150 nm and less than or equal to 1 sm.

Aspect 6

The transistor of aspect 5, wherein the thickness of the first interlayer insulating film is greater than or equal to 300 nm and less than or equal to 600 nm.

Aspect 7

The transistor of any one of aspects 1 to 6, wherein the carbon atoms contained in the top gate insulating film have a concentration of less than $5 \times 10^{17}$ atoms/cm$^3$.

Aspect 8

The transistor of aspect 7, wherein the top gate insulating film contains no carbon atoms.

Aspect 9

The transistor of any one of aspects 1 to 8, wherein the hydrogen atoms contained in the top gate insulating film have a concentration of greater than or equal to $1\times10^{17}$ atoms/cm$^3$ and less than $1\times10^{18}$ atoms/cm$^3$.

Aspect 10

The transistor of any one of aspects 1 to 9, wherein the top gate insulating film has a thickness of greater than or equal to 50 nm and less than or equal to 300 nm.

Aspect 11

The transistor of aspect 10, wherein the thickness of the top gate insulating film is greater than or equal to 100 nm and less than or equal to 200 nm.

Aspect 12

The transistor of any one of aspects 1 to 11, including, between the substrate and the oxide semiconductor film: a bottom gate electrode overlapping at least the channel region; and the bottom gate insulating film being in contact with the channel region and the bottom gate electrode and overlapping at least the bottom gate electrode, the bottom gate electrode and the bottom gate insulating film being provided in a stated order from a substrate side, wherein
the top gate electrode is electrically connected to the bottom gate electrode via a second contact hole formed through the top gate insulating film and the bottom gate insulating film.

Aspect 13

The transistor of any one of aspects 1 to 12, further including a second interlayer insulating film being in contact with the first interlayer insulating film and having formed a third contact hole overlapping the contact hole, wherein
the second interlayer insulating film is disposed farther from the substrate than is the first interlayer insulating film, and
the second interlayer insulating film is any of silicon nitride, silicon oxide, and silicon oxynitride.

Aspect 14

The transistor of aspect 13, further including a third interlayer insulating film being in contact with the second interlayer insulating film and having formed a fourth contact hole overlapping the third contact hole, wherein
the third interlayer insulating film is disposed farther from the substrate than is the second interlayer insulating film, and
the third interlayer insulating film is any of silicon nitride, silicon oxide, and silicon oxynitride.

Aspect 15

The transistor of any one of aspects 1 to 14, wherein the oxide semiconductor film contains oxygen and at least one element selected from indium (In), gallium (Ga), tin (Sn), hafnium (Hf), zirconium (Zr), and zinc (Zn).

Aspect 16

The transistor of aspect 15, wherein the oxide semiconductor film is any of an oxide semiconductor film containing indium (In), gallium (Ga), zinc (Zn), and oxygen, an oxide semiconductor film containing indium (In), tin (Sn), zinc (Zn), and oxygen, an oxide semiconductor film containing indium (In), zirconium (Zr), zinc (Zn), and oxygen, and an oxide semiconductor film containing indium (In), hafnium (Hf), zinc (Zn), and oxygen.

Aspect 17

The transistor of any one of aspects 1 to 16, wherein the channel region has a width of less than or equal to 4 µm in a direction from the first conductive region toward the second conductive region.

Aspect 18

A display device including the transistor of any one of aspects 1 to 17 and further including a light-emitting element including:
a first electrode electrically connected to either the source electrode or the drain electrode;
a second electrode; and
a light-emitting layer between the first electrode and the second electrode.

Aspect 19

A method of manufacturing a transistor, the method including the steps of:
forming an oxide semiconductor film on a substrate;
forming a top gate insulating film in contact with a portion of the oxide semiconductor film;
forming a top gate electrode overlapping the portion and the top gate insulating film and being in contact with the top gate insulating film;
forming an interlayer insulating film being in contact with the oxide semiconductor film except for the portion, with the top gate insulating film, and with the top gate electrode, containing carbon atoms, oxygen atoms, hydrogen atoms, and silicon atoms, containing hydrogen at a higher concentration than a concentration of hydrogen contained in the top gate insulating film, and containing oxygen at a lower concentration than a concentration of oxygen contained in the top gate insulating film;
forming a plurality of contact holes through the interlayer insulating film; and
forming a source electrode electrically connected to a first portion of the oxide semiconductor film other than the portion via one of the plurality of contact holes and a drain electrode electrically connected to a second portion of the oxide semiconductor film other than the portion via another one of the plurality of contact holes.

Aspect 20

The method of aspect 19, further including, before the step of forming the oxide semiconductor film on the substrate, the steps of:
forming a bottom gate electrode on the substrate; and
forming a bottom gate insulating film overlapping at least the bottom gate electrode, wherein
the bottom gate electrode overlaps at least the portion of the oxide semiconductor film, and
the bottom gate insulating film is in contact with the portion and the bottom gate electrode and overlaps at least the bottom gate electrode.

Aspect 21

The method of aspect 20, further including, between the step of forming the top gate insulating film and the step of forming the top gate electrode, the step of forming a second contact hole through the top gate insulating film and the bottom gate insulating film, wherein the top gate electrode is electrically connected to the bottom gate electrode via the second contact hole.

Additional Remarks

The disclosure is not limited to the description of the embodiments above and may be altered within the scope of the claims. Embodiments based on a proper combination of technical means disclosed in different embodiments are encompassed in the technical scope of the present invention. Furthermore, new technological features can be created by combining different technological means disclosed in the embodiments.

INDUSTRIAL APPLICABILITY

The disclosure is applicable to display devices.

The invention claimed is:

1. A transistor comprising:
a bottom gate insulating film, an oxide semiconductor film, a top gate insulating film, a top gate electrode, and a first interlayer insulating film, all of which are provided on a substrate in a stated order; and
a source electrode and a drain electrode both electrically connected to the oxide semiconductor film via a first contact hole formed through the first interlayer insulating film, wherein
the oxide semiconductor film has a channel region in a portion overlapping the top gate insulating film in a plan view,
the channel region is interposed between a first conductive region of the oxide semiconductor film and a second conductive region of the oxide semiconductor film,
the first interlayer insulating film is in contact with the first conductive region, the second conductive region, the top gate insulating film, and the top gate electrode and is containing carbon atoms, oxygen atoms, hydrogen atoms, and silicon atoms,
the hydrogen atoms contained in the first interlayer insulating film have a higher concentration than hydrogen atoms contained in the top gate insulating film, and
the oxygen atoms contained in the first interlayer insulating film have a lower concentration than oxygen atoms contained in the top gate insulating film.

2. The transistor according to claim 1, wherein the carbon atoms contained in the first interlayer insulating film have a concentration of greater than or equal to $5 \times 10^{17}$ atoms/cm$^3$.

3. The transistor according to claim 2, wherein the carbon atoms contained in the first interlayer insulating film have a concentration of greater than or equal to $1 \times 10^{18}$ atoms/cm$^3$.

4. The transistor according to claim 1, wherein the hydrogen atoms contained in the first interlayer insulating film have a concentration of greater than or equal to $1 \times 10^{18}$ atoms/cm$^3$ and less than or equal to $1 \times 10^{19}$ atoms/cm$^3$.

5. The transistor according to claim 1, wherein the first interlayer insulating film has a thickness of greater than or equal to 150 nm and less than or equal to 1 μm.

6. The transistor according to claim 5, wherein the thickness of the first interlayer insulating film is greater than or equal to 300 nm and less than or equal to 600 nm.

7. The transistor according to claim 1, wherein the carbon atoms contained in the top gate insulating film have a concentration of less than $5 \times 10^{17}$ atoms/cm$^3$.

8. The transistor according to claim 7, wherein the top gate insulating film contains no carbon atoms.

9. The transistor according to claim 1, wherein the hydrogen atoms contained in the top gate insulating film have a concentration greater than or equal to $1 \times 10^{17}$ atoms/cm$^3$ and less than $1 \times 10^{18}$ atoms/cm$^3$.

10. The transistor according to claim 1, wherein the top gate insulating film has a thickness of greater than or equal to 50 nm and less than or equal to 300 nm.

11. The transistor according to claim 10, wherein the thickness of the top gate insulating film is greater than or equal to 100 nm and less than or equal to 200 nm.

12. The transistor according to claim 1, further comprising, between the substrate and the oxide semiconductor film:
a bottom gate electrode overlapping at least the channel region; and
the bottom gate insulating film being in contact with the channel region and the bottom gate electrode and overlapping at least the bottom gate electrode, the bottom gate electrode and the bottom gate insulating film being provided in a stated order from a substrate side, wherein
the top gate electrode is electrically connected to the bottom gate electrode via a second contact hole formed through the top gate insulating film and the bottom gate insulating film.

13. The transistor according to claim 1, further comprising a second interlayer insulating film being in contact with the first interlayer insulating film and having formed a third contact hole overlapping the first contact hole, wherein
the second interlayer insulating film is disposed farther from the substrate than is the first interlayer insulating film, and
the second interlayer insulating film is any of silicon nitride, silicon oxide, and silicon oxynitride.

14. The transistor according to claim 13, further comprising a third interlayer insulating film being in contact with the second interlayer insulating film and having formed a fourth contact hole overlapping the third contact hole, wherein
the third interlayer insulating film is disposed farther from the substrate than is the second interlayer insulating film, and
the third interlayer insulating film is any of silicon nitride, silicon oxide, and silicon oxynitride.

15. The transistor according to claim 1, wherein the oxide semiconductor film contains oxygen and at least one element selected from indium (In), gallium (Ga), tin (Sn), hafnium (Hf), zirconium (Zr), and zinc (Zn).

16. The transistor according to claim 15, wherein the oxide semiconductor film is any of an oxide semiconductor film containing indium (In), gallium (Ga), zinc (Zn), and oxygen, an oxide semiconductor film containing indium (In), tin (Sn), zinc (Zn), and oxygen, an oxide semiconductor film containing indium (In), zirconium (Zr), zinc (Zn), and oxygen, and an oxide semiconductor film containing indium (In), hafnium (Hf), zinc (Zn), and oxygen.

17. The transistor according to claim 1, wherein the channel region has a width of less than or equal to 4 μm in a direction from the first conductive region toward the second conductive region.

18. A display device comprising:
the transistor according to claim 1; and
a light-emitting element including:
a first electrode electrically connected to either the source electrode or the drain electrode;
a second electrode; and a light-emitting layer between the first electrode and the second electrode.

19. A method of manufacturing a transistor, the method comprising:
forming an oxide semiconductor film on a substrate;
forming a top gate insulating film in contact with a portion of the oxide semiconductor film;
forming a top gate electrode overlapping the portion and the top gate insulating film and being in contact with the top gate insulating film;
forming an interlayer insulating film being in contact with the oxide semiconductor film except for the portion, with the top gate insulating film, and with the top gate electrode, wherein the interlayer insulating film contains carbon atoms, oxygen atoms, hydrogen atoms, and silicon atoms, the hydrogen atoms contained in the first interlayer insulating film have a higher concentration than hydrogen atoms contained in the top gate insulating film, and the oxygen atoms contained in the first interlayer insulating film have a lower concentration than oxygen atoms contained in the top gate insulating film;
forming a plurality of contact holes through the interlayer insulating film; and
forming a source electrode electrically connected to a first portion of the oxide semiconductor film other than the portion via one of the plurality of contact holes and a drain electrode electrically connected to a second portion of the oxide semiconductor film other than the portion via another one of the plurality of contact holes.

20. The method according to claim 19, further comprising, before forming the oxide semiconductor film on the substrate:
forming a bottom gate electrode on the substrate; and
forming a bottom gate insulating film overlapping at least the bottom gate electrode, wherein
the bottom gate electrode overlaps at least the portion of the oxide semiconductor film, and
the bottom gate insulating film is in contact with the portion and the bottom gate electrode and overlaps at least the bottom gate electrode.

21. The method according to claim 20, further comprising, between forming the top gate insulating film and forming the top gate electrode:
forming a first contact hole, among the plurality of contact holes, through the top gate insulating film and the bottom gate insulating film, wherein
the top gate electrode is electrically connected to the bottom gate electrode via the first contact hole.

* * * * *